(12) United States Patent
Nasu

(10) Patent No.: US 10,887,991 B2
(45) Date of Patent: Jan. 5, 2021

(54) WIRING SUBSTRATE FOR INSPECTION APPARATUS

(71) Applicant: NGK SPARK PLUG CO., LTD., Aichi (JP)

(72) Inventor: Takakuni Nasu, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 84 days.

(21) Appl. No.: 16/270,832

(22) Filed: Feb. 8, 2019

(65) Prior Publication Data

US 2019/0261514 A1    Aug. 22, 2019

(30) Foreign Application Priority Data

Feb. 19, 2018 (JP) ................................ 2018-027329

(51) Int. Cl.
*G01R 31/00* (2006.01)
*G01R 1/073* (2006.01)
(Continued)

(52) U.S. Cl.
CPC ......... *H05K 1/141* (2013.01); *G01R 1/07342* (2013.01); *G01R 31/2831* (2013.01);
(Continued)

(58) Field of Classification Search
CPC ............ G01R 1/07314; G01R 1/07342; G01R 1/07378; G01R 1/0491; G01R 31/2831;
(Continued)

(56) References Cited

U.S. PATENT DOCUMENTS

2005/0277323 A1    12/2005  Eldridge et al.
2007/0290705 A1*   12/2007  Eldridge ............ G01R 1/07342
                                                324/754.07
(Continued)

FOREIGN PATENT DOCUMENTS

JP    2004-336062 A    11/2004
JP    2012-093194 A    5/2012
(Continued)

OTHER PUBLICATIONS

Japan Patent Office, Office Action (Notice of Reasons for Refusal) issued in corresponding Application No. 2018-027329, dated Sep. 15, 2020.
(Continued)

*Primary Examiner* — Minh N Tang
(74) *Attorney, Agent, or Firm* — Stites & Harbison, PLLC; Jeffrey A. Haeberlin; James R. Hayne

(57) ABSTRACT

A wiring substrate for inspection apparatus includes a base substrate and a plurality of tile substrates. The tile substrate is composed of a ceramic substrate section and a first resin substrate section. Each ceramic substrate section is composed of a plurality of ceramic layers and has a plurality of upper-surface connection terminals provided on an upper surface thereof, a plurality of lower-surface connection terminals provided on a lower surface thereof, and a plurality of through conductors for conducting electricity between the upper-surface connection terminals and the lower-surface connection terminals. The first resin substrate section is laminated on the upper surface and includes a laminate of a plurality of resin layers, a plurality of probe pads formed on a resin front-surface thereof, a plurality of inner wiring layers formed between the resin layers, and a plurality of electrically conductive paths for conducting electricity
(Continued)

between the probe pads and the upper-surface connection terminals.

4 Claims, 4 Drawing Sheets

(51) Int. Cl.
*H05K 1/14* (2006.01)
*H05K 1/11* (2006.01)
*H05K 1/03* (2006.01)
*G01R 31/28* (2006.01)

(52) U.S. Cl.
CPC ......... *H05K 1/0306* (2013.01); *H05K 1/0346* (2013.01); *H05K 1/113* (2013.01); *H05K 2201/0154* (2013.01); *H05K 2201/10378* (2013.01)

(58) Field of Classification Search
CPC .... G01R 31/2889; H01K 1/113; H01K 1/141; H01K 1/0306; H01K 1/0346; H01K 1/0271; H01K 1/0268; H01K 3/429; H01K 3/4061
See application file for complete search history.

(56) References Cited

U.S. PATENT DOCUMENTS

| | | | |
|---|---|---|---|
| 2009/0051041 A1* | 2/2009 | Otsuka | H05K 3/4617 257/774 |
| 2016/0323996 A1 | 11/2016 | Takemura | |
| 2017/0122981 A1 | 5/2017 | Nasu et al. | |
| 2018/0224481 A1* | 8/2018 | Kim | G01R 1/07378 |

FOREIGN PATENT DOCUMENTS

| | | |
|---|---|---|
| JP | 2013-029431 A | 2/2013 |
| KR | 2017-0052471 A | 5/2017 |
| WO | 96/38858 A2 | 12/1996 |
| WO | 2015-108051 A1 | 7/2015 |

OTHER PUBLICATIONS

Korean Intellectual Property Office, Office Action (Notification of Reason for Refusal) issued in corresponding Application No. 10-2019-0016214, dated Jul. 29, 2020.

* cited by examiner

WIRING SUBSTRATE FOR INSPECTION APPARATUS

CROSS REFERENCE TO RELATED APPLICATION

The present application claims priority to Japanese Patent Application No. 2018-027329, which was filed on Feb. 19, 2018, the disclosure of which is herein incorporated by reference in its entirety.

BACKGROUND OF THE INVENTION

Field of the Invention

The present invention relates to a wiring substrate for use in an inspection apparatus for individually inspecting electrical characteristics of, for example, a large number of electronic components formed along the surface of a silicon wafer.

Description of Related Art

For example, in order to individually inspect electrical characteristics of a large number of electronic components formed along the surface of a silicon wafer having a diameter of about 30 cm, contact carriers (tiles) have been proposed for use in a probe card configured such that a large number of tile substrates individually corresponding to a large number of the electronic components (chips) are mounted on the surface of a large electronic component substrate (a larger insulating substrate) corresponding to the silicon wafer in plan view (see, for example, FIG. 7 of Patent Document 1 and description thereof).

However, since the tile substrate is formed of an insulating material, such as ceramic, electrically conductive paths, such as inner wiring layers and via conductors, formed in the tile substrate tend to become thick. Also, since firing shrinkage in firing ceramic must be considered in providing spacing between surface pads formed on the surface of the tile substrate, difficulty is encountered in providing very narrow spacing. As a result, difficulty is encountered in forming electrically conductive paths with high precision in the tile substrate, and impedance matching is apt to become unstable. As a result, there has been a potential failure to conduct high-precision inspection through a plurality of interconnection elements which free-stand on the surface of the tile substrate and come into electrical contact with an electronic component to be inspected.

RELATED ART DOCUMENT

Patent Document 1 is Japanese Patent Application Laid-Open (kokai) No. 2004-336062 (pages 1 to 49, FIGS. 1 to 12).

BRIEF SUMMARY OF THE INVENTION

The present invention has been accomplished so as to solve the problem described in Background Art, and an object of the present invention is to reliably provide a wiring substrate for inspection apparatus having a plurality of tile substrates, each of which can achieve a reduction in overall size, has high-precision electrically conductive paths provided therein, can achieve narrow spacing between surface pads, and realizes stable impedance matching.

In order to solve the above problem, the present invention has been conceived according to the following idea: each of a plurality of tile substrates mounted on the base front-surface of a base substrate having a relatively large size in plan view is composed of a resin substrate section including a plurality of resin layers and constituting a front surface portion having a plurality of pads for probe, and a ceramic substrate section laminated on the back surface of the resin substrate section.

Specifically, a wiring substrate for inspection apparatus of the present invention comprises a single base substrate and a plurality of tile substrates. The base substrate is formed of an insulating material, has a base front-surface and a base back-surface located on opposite sides of the base substrate, and has a plurality of electrically conductive paths for conducting electricity between a plurality of base front-surface terminals provided on the base front-surface and a plurality of base back-surface terminals provided on the base back-surface, and a plurality of electrically conductive paths for conducting electricity between the plurality of base front-surface terminals and the plurality of back-surface terminals. In other words, the base substrate includes a plurality of base front-surface terminals provided on the base front-surface, a plurality of base back-surface terminals provided on the base back-surface, and a plurality of electrically conductive paths for conducting electricity between the plurality of base front-surface terminals and the plurality of back-surface terminals A plurality of the tile substrates are mounted on the base front-surface terminals of the base substrate. Each tile substrate has a front surface and a back surface located on opposite sides of the tile substrate and includes a plurality of pads for probe (i.e., probe pads) provided on the front surface and a plurality of back-surface connection terminals provided on the back surface. The wiring substrate for inspection apparatus is characterized in that the tile substrate comprises (includes) a ceramic substrate section and a first resin substrate section. The ceramic substrate section has an upper surface and a lower surface located on opposite sides of the ceramic substrate, and includes a single or a plurality of ceramic layers, a plurality of upper-surface connection terminals provided on the upper surface, a plurality of lower-surface connection terminals provided on the lower surface, and a plurality of through conductors for conducting electricity between the upper-surface connection terminals and the lower-surface connection terminals. The first resin substrate section is laminated on the upper surface of the ceramic substrate section and includes a laminate of a plurality of resin layers having a resin front-surface and a resin back-surface located on opposite sides of the laminate, a plurality of the pads for probe (i.e., probe pads) formed on the resin front-surface (i.e., one or more of the plurality of probe pads formed on the resin front-surface), a plurality of inner wiring layers formed between the resin layers, and a plurality of electrically conductive paths for conducting electricity between the pads for probe (i.e., probe pads) and the upper-surface connection terminals through the respective inner wiring layers.

Notably, the front surface of the tile substrate and the resin front-surface of the first resin substrate section are the same surface. The back surface of the tile substrate and the lower surface of the ceramic substrate section are the same surface.

The wiring substrate for inspection apparatus yields the following effects (1) and (2).

(1) The tile substrate is composed of the ceramic substrate section and the first resin substrate section laminated on the upper surface of the ceramic substrate section and having a plurality of the resin layers, a plurality of the inner wiring layers formed between the resin layers, a plurality of the pads for probe formed on the resin front-surface, and a plurality of the electrically conductive paths for conducting electricity between the pads for probe and a plurality of the upper-surface connection terminals provided on the upper surface of the ceramic substrate section. Accordingly, since the first resin substrate section does not need to consider firing shrinkage as in the case of ceramic, and the first resin substrate section has a plurality of the inner wiring layers having a relatively thin line width and disposed therein accurately at very narrow spacing, electricity can be supplied to the pads for probe with stable impedance matching, and inspection current from the pads for probe can be sent to the ceramic substrate section with stable impedance matching. Further, the pads for probe can be disposed at very narrow spacing. Therefore, there can be provided a wiring substrate for inspection apparatus having a plurality of the tile substrates, each of which is reduced in overall size and has the high-precision inner wiring layers having stable impedance matching, and the pads for probe disposed at very narrow spacing.

(2) Since the tile substrate is a composite substrate in which the ceramic substrate section and the first resin substrate section are laminated together, and the ceramic substrate section ensures the strength of the entire tile substrate, a plurality of the ceramic substrate sections and as many resin substrate sections as the ceramic substrate sections can be fabricated relatively easily from a single multipiece substrate, and the strength of the individual tile substrates singulated from the multipiece substrate can be reliably ensured. Therefore, there can be provided a wiring substrate for inspection apparatus in which the individual tile substrates are readily mountable or demountable.

An insulating material used to form the base substrate is ceramic or resin and is formed by laminating a plurality of layers of such an insulating material.

The base substrate has a base front-surface and a base back-surface in the form of a circle or a regular polygon or a deformed polygon equal to or greater than an octagon in terms of number of sides in plan view.

Further, electrically conductive paths located within the base substrate are composed of via conductors (including lands intervening therebetween) extending through the base substrate along the thickness direction of the base substrate between the base front-surface and the base back-surface, or the via conductors and any number of inner wiring layers connected to the via conductors at intermediate positions of the via conductors.

The ceramic substrate section of the tile substrate is formed of, for example, a low-temperature co-fired ceramic, such as glass-ceramic, or a high-temperature co-fired ceramic, such as alumina.

Further, a plurality of the resin layers of the resin substrate section of the tile substrate are formed of, for example, a laminate of films of polyimide (PI) having excellent heat resistance, or a laminate of resin layers formed by application of resin paste.

The upper-surface connection terminals and the lower-surface connection terminals formed on the upper surface and the lower surface of the ceramic substrate section are formed of, for example, copper or silver and co-fired with the ceramic layers.

Further, the through conductors provided within the ceramic substrate section are composed of via conductors extending through the ceramic substrate section between the upper surface and the lower surface of the ceramic substrate section, or the via conductors and lands or inner wiring layers disposed at intermediate positions of the via conductors, and are formed of copper or silver, or a copper-based alloy or a silver-based alloy.

Additionally, the pads for probe formed on the resin front-surface of the resin substrate section, the inner wiring layers, and the electrically conductive paths composed primarily of via conductors are formed of copper or silver, or a copper-based alloy or a silver-based alloy.

The present invention encompasses a wiring substrate for inspection apparatus in which the (each) tile substrate further comprises a second resin substrate section laminated on the lower surface of the ceramic substrate section and includes a laminate of a plurality of second resin layers having a second resin front-surface and a second resin back-surface located on opposite sides of the laminate, a plurality of second resin front-surface connection terminals formed on the second resin front-surface, a plurality of second inner wiring layers formed between the second resin layers, and a plurality of electrically conductive paths for conducting electricity between the second resin front-surface connection terminals and the lower-surface connection terminals through the respective second inner wiring layers.

The above wiring substrate for inspection apparatus further yields the following effect (3).

(3) Since the tile substrate is configured such that the first resin substrate section is laminated on the upper surface of the ceramic substrate section while the second resin substrate section is laminated on the lower surface of the ceramic substrate section, in the course of fabrication, a multipiece substrate and the individual tile substrates singulated from the multipiece substrate restrain their warpage in their thickness direction, which could otherwise result from thermal imbalance along the thickness direction. Therefore, the wiring substrate for inspection apparatus is such that a plurality of the tile substrates each having a flat front surface are mounted on the base front-surface of the base substrate.

Notably, in the case where the first and the second resin substrate sections are laminated on the upper surface and the lower surface, respectively, of the ceramic substrate section, in view of restraint of warpage of the tile substrate, it is recommended that the first resin substrate section and the second resin substrate section be line symmetric or approximately line symmetric in terms of number of resin layers and thickness of individual resin layers.

Further, the present invention encompasses a wiring substrate for inspection apparatus in which a plurality of the tile substrates each have a rectangular shape in plan view and are mounted adjacent to one another on the base front-surface of the base substrate in plan view.

The above wiring substrate for inspection apparatus can further yield the following effect (4) in addition to the aforementioned effects.

(4) The wiring substrate for inspection apparatus yields the effects (1) and (2) or the effects (1) to (3) and can inspect individually and efficiently the electrical characteristics of a large number of electronic components with high precision.

Notably, the term "adjacent" indicates not only disposition of the tile substrates with their side surfaces in contact with each other but also disposition of the tile substrates with predetermined spacing between their side surfaces.

The present invention encompasses a wiring substrate for inspection apparatus in which a plurality of the base front-surface terminals provided on the base front-surface of the base substrate and (i) a plurality of the back-surface connection terminals formed on the back surface of the tile substrate or (ii) a plurality of the second resin front-surface connection terminals formed on the second resin front-surface of the tile substrate are individually electrically connected through solder.

The above wiring substrate for inspection apparatus can more reliably yield the effect (4).

Additionally, the present invention encompasses a wiring substrate for inspection apparatus in which a probe pin stands on an upper surface of each of the pads for probe (i.e., probe pads) formed on the resin front-surface of the first resin substrate section of the tile substrate.

The above wiring substrate for inspection apparatus can more reliably yield the effect (4).

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

An embodiment of the present invention will next be described.

Figure 1A:
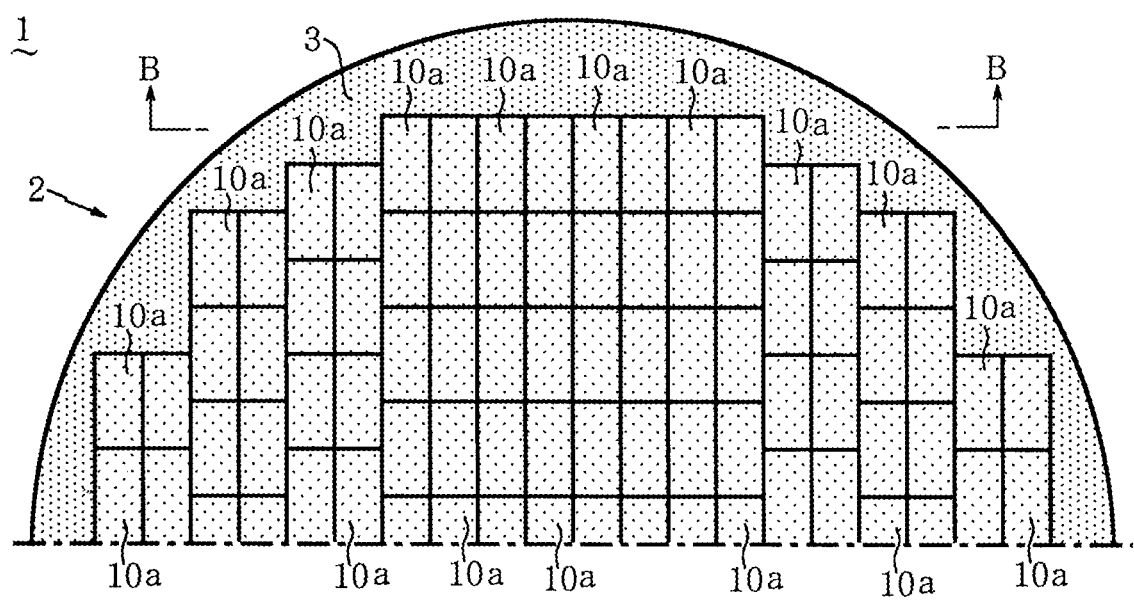
FIG. 1(A) is a fragmentary plan view showing a wiring substrate for inspection apparatus according to an embodiment of the present invention.
Figure 1B:
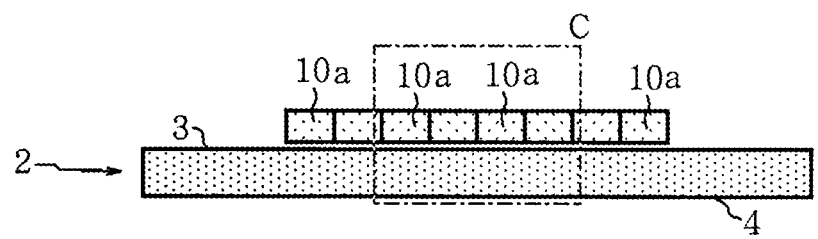
FIG. 1(B) is a fragmentary vertical sectional view taken along line B-B of FIG. 1(A).

FIG. 1(A) is a fragmentary plan view showing a wiring substrate for inspection apparatus 1 according to an embodiment of the present invention, and FIG. 1(B) is a fragmentary vertical sectional view taken along line B-B of FIG. 1(A).

As shown in FIGS. 1(A) and 1(B), the wiring substrate for inspection apparatus (hereinafter, called merely the wiring substrate) 1 includes a disk-shaped base substrate 2 having a base front-surface 3 and a base back-surface 4 having a circular shape in plan view and located on opposite sides of the base substrate 2, and a plurality of tile substrates 10a mounted on the base front-surface 3 of the base substrate 2 adjacent to one another in plan view. Each tile substrate 10a has a rectangular shape in plan view measuring about 10 mm to 15 mm in length of long side and about 5 mm to 7 mm in length of short side.

Figure 1C:
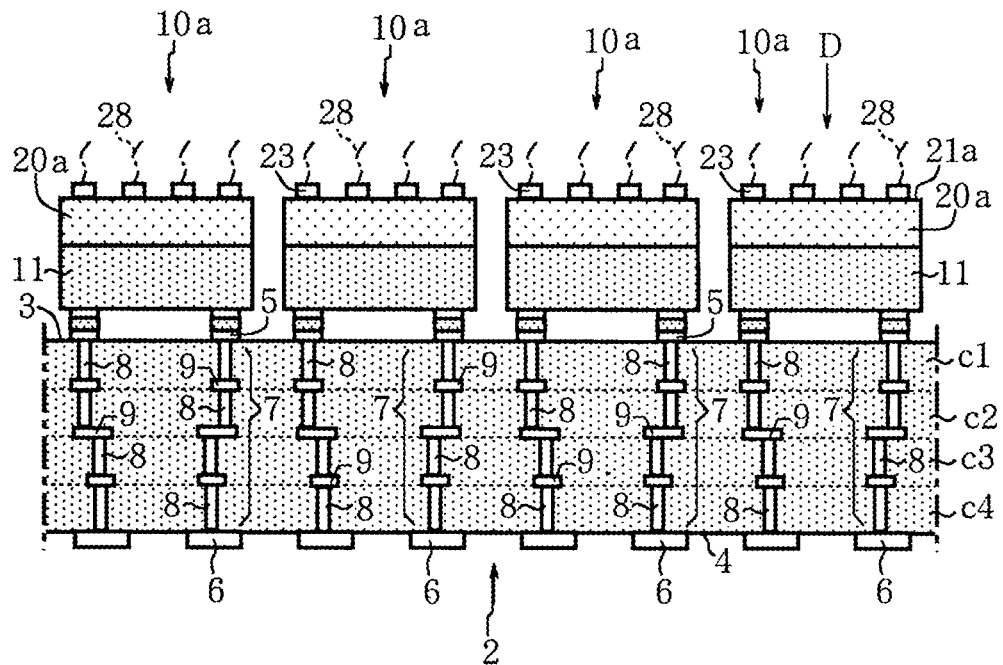
FIG. 1(C) is an enlarged view of a portion surrounded by dash-dot line C of FIG. 1(B).

As shown in FIG. 1(C), the base substrate 2 is a laminate of a plurality of ceramic layers (insulating materials) c1 to c4 and has a plurality of base front-surface terminals 5 provided on the base front-surface 3, a plurality of base back-surface terminals 6 provided on the base back-surface 4, and a plurality of electrically conductive paths 7 for conducting electricity individually between the base front-surface terminals 5 and the base back-surface terminals 6. As illustrated, each electrically conductive path 7 is composed of a plurality of via conductors 8 extending individually through the ceramic layers c1 to c4 along the thickness direction of the base substrate 2 and a plurality of lands 9 or inner wiring layers 9 each being disposed between adjacent two of the via conductors 8 and between adjacent two of the ceramic layers c1 to c4.

The diameter of the base front surface 3 and the base back surface 4 in plan view is equal to or slightly larger than the diameter of a silicon wafer to be inspected.

The ceramic layers c1 to c4 are formed primarily of, for example, alumina.

Further, the base front-surface terminals 5, the base back-surface terminals 6, the via conductors 8, and the lands 9 or the inner wiring layers 9 are formed primarily of, for example, tungsten (hereinafter, written merely as W) or molybdenum (hereinafter, written merely as Mo).

Additionally, externally exposed surfaces of the base front-surface terminals 5 and the base back-surface terminals 6 are coated sequentially with a nickel film and a gold film by electroplating.

As shown in FIG. 1(C), the tile substrate 10a is mounted on a plurality of the base front-surface terminals 5 of the base substrate 2 and is composed of a ceramic substrate section 11 located toward the base substrate 2, and a first resin substrate section 20a laminated on an upper surface 12 (exterior side) of the ceramic substrate section 11.

Figure 1D:
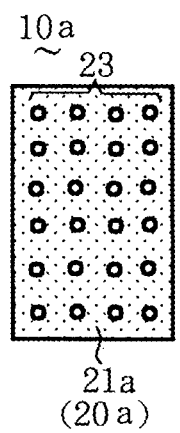
FIG. 1(D) is a plan view of one tile substrate as viewed in the direction of arrow D of FIG. 1(C).

As shown in FIG. 1(D), 24 (a plurality of) pads for probe 23 are disposed in a grid array fashion on a resin front-surface 21a of the first resin substrate section 20a in plan view. Notably, a plurality of the pads for probe 23 may be disposed in a staggered array or a checkered pattern in plan view.

Figure 2:
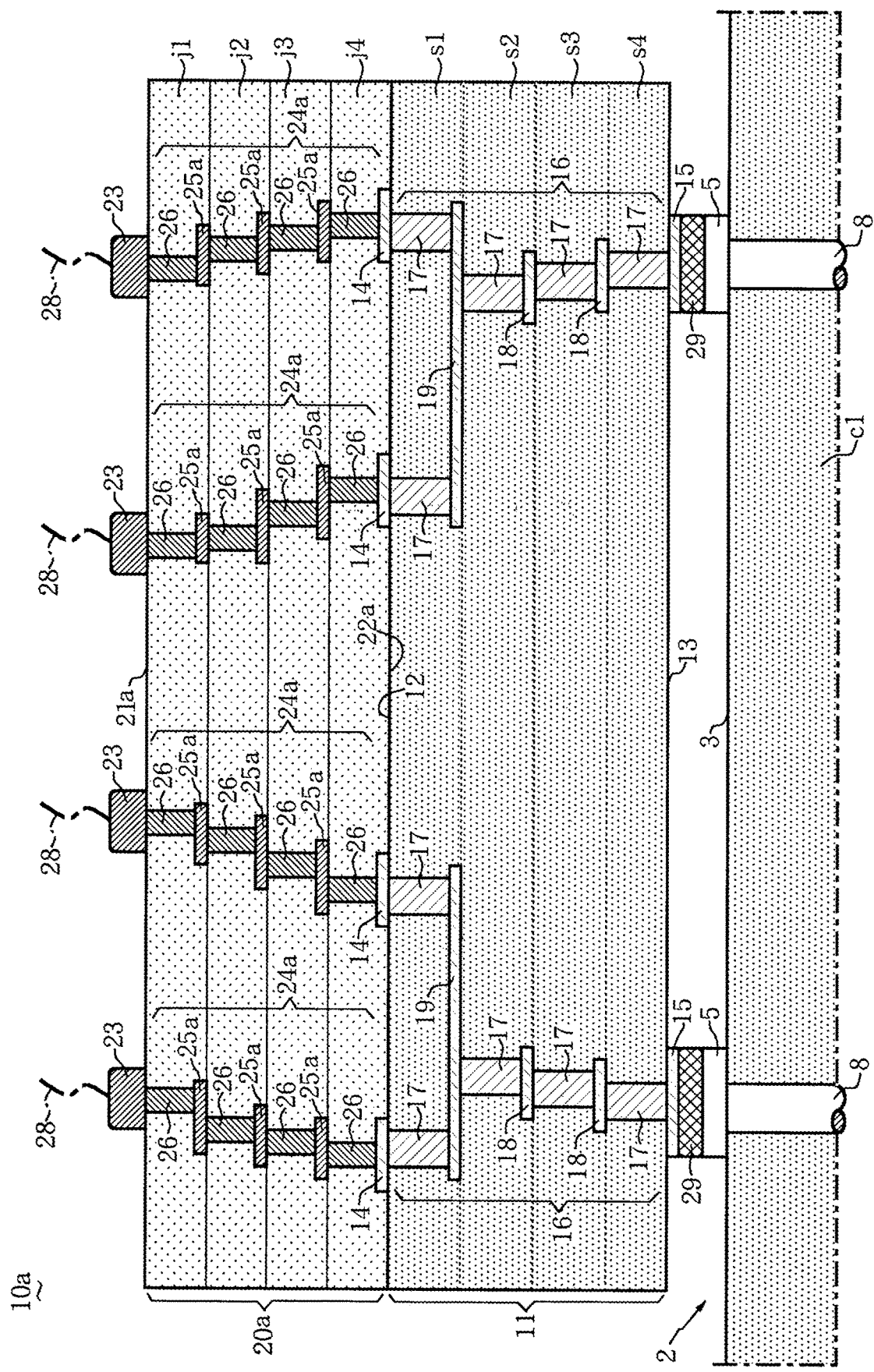
FIG. 2 is a vertical sectional view showing one tile substrate shown in FIG. 1 and its mounting area.

FIG. 2 is a vertical sectional view showing one tile substrate 10a and its mounting area. As shown in FIG. 2, the ceramic substrate section 11 of the tile substrate 10a is a laminate of a plurality of ceramic layers s1 to s4 and has an upper surface 12 and a lower surface 13 located on opposite sides of the ceramic substrate section 11 and having the aforementioned rectangular shape in plan view. Notably, the lower surface 13 of the ceramic substrate section 11 also serves as a back surface 13 of the tile substrate 10a.

A plurality of inner wiring layers 18 and 19 are formed between the ceramic layers s1 to s4, and a plurality of upper-surface connection terminals 14 are formed on the upper surface 12 residing on the uppermost ceramic layer s1. Further, a plurality of lower-surface connection terminals 15 are formed on the lower surface 13 residing on the lowermost ceramic layer c4. As shown in FIG. 2, the lower-surface connection terminals 15 are individually electrically connected to the base front-surface terminals 5 of the base substrate 2 through solder 29. The solder 29 is formed of, for example, an Au—Sn alloy.

As shown in FIG. 2, a plurality of through conductors 16 are formed between the upper-surface connection terminals 14 and the lower-surface connection terminals 15. Each through conductor 16 is composed of a plurality of via conductors 17 extending individually through the respective ceramic layers s1 to s4 along the thickness direction and the inner wiring layers 18 and 19 each being disposed between adjacent two of the via conductors 17.

Notably, the ceramic layers s1 to s4 are formed of a low-temperature co-fired ceramic, such as glass-ceramic. The upper-surface connection terminals 14, the lower-surface connection terminals 15, the via conductors 17, and the inner wiring layers 18 and 19 are formed primarily of copper or silver.

Further, all or some of the inner wiring layers 18 may be lands.

Additionally, at least the inner wiring layers 19 have a line width of about 50 µm in plan view.

As shown in FIG. 2, the first resin substrate section 20a of the tile substrate 10a is a laminate of a plurality of resin layers j1 to j4 and has the resin front-surface 21a and a resin back-surface 22a located on opposite sides of the first resin substrate section 20a and having the aforementioned rectangular shape in plan view. Notably, the resin front-surface 21a of the first resin substrate section 20a also serves as the front surface 21a of the tile substrate 10a.

The tile substrate 10a has a plurality of inner wiring layers 25a each formed between adjacent two of the resin layers j1 to j4, and a plurality of the pads for probe 23 are formed on the resin front-surface 21a residing on the uppermost resin layer j1. A probe pin 28 is provided later in a standing fashion on the upper surface of each pad for probe 23.

Further, a plurality of electrically conductive paths 24a are formed between the pads for probe 23 and the resin back-surface 22a. Each electrically conductive path 24a is composed of a plurality of via conductors 26 extending individually through the resin layers j1 to j4 along the thickness direction and the inner wiring layers 25a each being disposed between adjacent two of the via conductors 26.

As shown in FIG. 2, the via conductors 26 extending through the lowermost resin layer j4 are electrically connected to the upper-surface connection terminals 14 of the ceramic substrate section 11.

The resin layers j1 to j4 are formed, for example, by laminating films of polyimide (PI) having excellent heat resistance. The pads for probe 23, the inner wiring layers 25a, and the via conductors 26 are formed of copper or silver at the positions shown in FIG. 2 by photolithography (e.g., subtractive process).

Thus, at least the inner wiring layers 25a are formed at a spacing of 20 μm to 300 μm while having a relatively thin line width of about 25 μm or less in plan view. As a result, since the electrically conductive paths 24a including the inner wiring layers 25a can reliably send even a relatively small current, stable matching of impedance (about 200Ω) can be ensured.

Further, since the pads for probe 23 are formed at a spacing (pitch) of 100 μm to 300 μm, an electrical inspection can be conducted on wiring of electronic components to be inspected, such as IC chips, disposed at very narrow spacing.

The first resin substrate section 20a is bonded at the resin back-surface 22a onto the upper surface 12 of the ceramic substrate section 11 through an adhesive layer (not shown) applied to positions other than those of the upper-surface connection terminals 14, thereby yielding the tile substrate 10a. The tile substrates 10a are mounted on the base front-surface terminals 5 located on the base front-surface 3 of the base substrate 2 through the solder 29, thereby yielding the wiring substrate 1 shown in FIGS. 1(A) to 1(C). Notably, externally exposed surfaces of, at least, the pads for probe 23 and the lower-surface connection terminals 15 are coated with a nickel film and a gold film as in the case of the base front-surface terminals 5 and the base back-surface terminals 6.

The wiring substrate 1 is mounted on an unillustrated inspection apparatus such that a plurality of the base back-surface terminals 6 provided on the base back-surface 4 of the base substrate 2 are electrically connected to external connection terminals of the inspection apparatus, whereby each electronic component (one chip) in contact with the corresponding probe pins 28 can be accurately inspected for electrical characteristics.

According to the above-described wiring substrate 1, each tile substrate 10a is composed of the ceramic substrate section 11 and the first resin substrate section 20a, and the first resin substrate section 20a is laminated on the upper surface 12 of the ceramic substrate section 11 and has a plurality of the resin layers j1 to j4, a plurality of the inner wiring layers 25a formed between the resin layers j1 to j4, a plurality of the pads for probe 23 formed on the resin front-surface 21a, and a plurality of the electrically conductive paths 24a for conducting electricity between the pads for probe 23 and a plurality of the upper-surface connection terminals 14 provided on the upper surface 12 of the ceramic substrate section 11. Accordingly, since the first resin substrate section 20a has a plurality of the inner wiring layers 25a having a relatively thin line width and disposed therein accurately at very narrow spacing, electricity can be supplied to the pads for probe 23 with stable impedance matching, and current from the pads for probe 23, which reflects the results of inspection, can be sent to the ceramic substrate section 11 with stable impedance matching. Also, the pads for probe 23 can be disposed at narrow spacing. Therefore, there can be provided the wiring substrate 1 having a plurality of the tile substrates, each of which is reduced in overall size and has the high-precision inner wiring layers realizing stable impedance matching.

Further, since the tile substrate 10a is a composite substrate in which the ceramic substrate section 11 and the first resin substrate section 20a are laminated together, and the ceramic substrate section 11 ensures the strength of the entire tile substrate 10a, a plurality of the ceramic substrate sections 11 and as many first resin substrate sections 20a as the ceramic substrate sections 11 can be fabricated relatively easily from a single multipiece substrate, and the strength of the individual tile substrates 10a singulated from the multipiece substrate can be reliably ensured. Therefore, there can be provided the wiring substrate 1 in which the individual tile substrates 10a are readily mountable or demountable.

Therefore, the wiring substrate 1 can reliably yield the aforementioned effects (1), (2), and (4).

Figure 3:
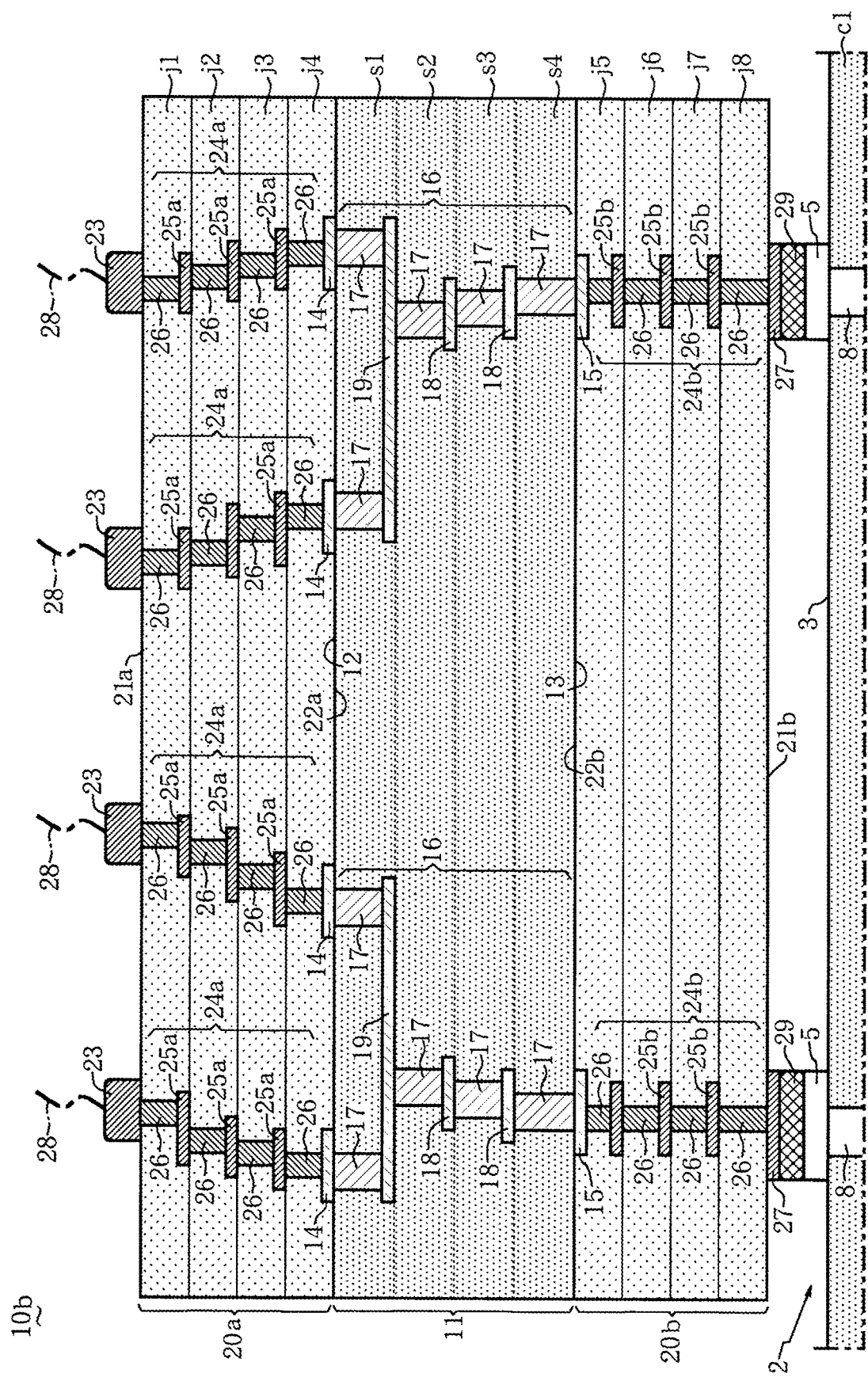
FIG. 3 is a vertical sectional view showing a modification of the tile substrate and its mounting area.

FIG. 3 is a vertical sectional view showing a tile substrate 10b, which is a modification of the tile substrate 10a, and its mounting area.

As shown in FIG. 3, the tile substrate 10b includes the ceramic substrate section 11 and the first resin substrate section 20a laminated on the upper surface 12 of the ceramic substrate section 11. The tile substrate 10b further includes a second resin substrate section 20b laminated on the lower surface 13 of the ceramic substrate section 11 approximately line symmetric to the first resin substrate section 20a (approximately symmetric with respect to the ceramic substrate section 11).

The second resin substrate section 20b includes a plurality of second resin layers j5 to j8 formed of polyimide (PI) as in the case of the first resin substrate section 20a and assuming the form of a laminate of films each having a thickness similar to that of the case of the first resin substrate section 20a, a second resin front-surface 21b residing on the lowermost resin layer j8 in FIG. 3, a second resin back-surface 22b residing on the uppermost resin layer j5 in FIG. 3, a plurality of second inner wiring layers 25b formed between the second resin layers j5 to j8, and a plurality of second resin front-surface connection terminals 27 formed on the second resin front-surface 21b. Notably, the second resin front-surface 21b also serves as a back surface 21b of the tile substrate 10b.

A plurality of second electrically conductive paths 24b are disposed between the second resin front-surface connection terminals 27 and the second resin back-surface 22b. Each second electrically conductive path 24b is composed of the via conductors 26 extending individually through the respective second resin layers j5 to j8 and the second inner wiring layers 25b each being disposed between adjacent two of the via conductors 26. Notably, all or some of the second inner wiring layers 25b may be lands.

As shown in FIG. 3, in each second electrically conductive path 24b, the via conductor 26 extending through the uppermost second resin layer j5 can be electrically connected, at its end located toward the second resin back-surface 22b, to the lower-surface connection terminal 15 of the ceramic substrate section 11.

Further, a plurality of the second resin front-surface connection terminals 27 are individually electrically conductive to the base front-surface terminals 5 of the base substrate 2 through the solder 29, and the tile substrate 10b is mounted on the base front-surface 3 of the base substrate 2 in such electrically conductive condition.

Additionally, the surfaces of the second resin front-surface connection terminals 27 are coated sequentially with a nickel film and a gold film as in the case of the lower-surface connection terminals 15 of the tile substrate 10a.

According to the wiring substrate 1 having a plurality of the tile substrates 10b mounted on the base front-surface 3 of the base substrate 2, since the tile substrate 10b is configured such that the first resin substrate section 20a is laminated on the upper surface 12 of the ceramic substrate section 11 while the second resin substrate section 20b is laminated on the lower surface 13 of the ceramic substrate section 11, in the course of fabrication (e.g., in a curing process), a multipiece substrate and the individual tile substrates 10b singulated from the multipiece substrate restrain their warpage in their thickness direction, which could otherwise result from thermal imbalance along the thickness direction. Therefore, the wiring substrate 1 is such that a plurality of the tile substrates 10b each having a flat front surface 21a are accurately mounted on the base front-surface 3 of the base substrate 2.

Therefore, the wiring substrate 1 in which a plurality of the tile substrates 10b are mounted on the base front-surface 3 of the base substrate 2 can yield the aforementioned effects (1) to (4).

The present invention is not limited to the embodiments described above.

For example, an insulating material used to form the base substrate may be a ceramic other than alumina (e.g., mullite or aluminum nitride), an epoxy resin, or a composite material in which any number of ceramic layers and resin layers are laminated together.

The base substrate may have a base front-surface and a base back-surface in the form of a regular polygon or a deformed polygon equal to or greater than an octagon in terms of number of sides in plan view.

Further, the tile substrate may have a front surface and a back surface in the form of square or approximately square in plan view.

A plurality of the tile substrates may be mounted on the base front-surface of the base substrate primarily in a staggered array or a checkered pattern in plan view. Alternatively, a plurality of the tile substrates may be mounted in such a mixed pattern that a checkered pattern and a grid pattern are adjacent to each other.

Further, each of the ceramic substrate sections 11 of the tile substrates 10a and 10b may be formed of a single ceramic layer such that a plurality of via conductors (corresponding to the through conductors 16) extend through the single ceramic layer.

Also, the ceramic layers sn of the ceramic substrate section 11 may be formed of a high-temperature co-fired ceramic, such as alumina or mullite. In this case, W or Mo is used to form the upper-surface connection terminals 14, the lower-surface connection terminals 15, the via conductors 17, and the inner wiring layers 18 and 19.

Additionally, the first resin substrate section 20a (second resin substrate section 20b) may be a laminate of two or three resin layers (second resin layers), or five or more resin layers (second resin layers).

The present invention can reliably provide a wiring substrate for inspection apparatus having a plurality of tile substrates, each of which can be reduced in overall size and has high-precision electrically conductive paths disposed therein and stable impedance matching.

DESCRIPTION OF REFERENCE NUMERALS

1: wiring substrate for inspection apparatus
2: base substrate
3: base front-surface
4: base back-surface
5: base front-surface terminal
6: base back-surface terminal
7: electrically conductive path
10a, 10b: tile substrate
11: ceramic substrate section
12: upper surface
13: lower surface/back surface
14: upper-surface connection terminal
15: lower-surface connection terminal
16: through conductor
20a: first resin substrate section
20b: second resin substrate section
21a: resin front-surface/front surface
21b: second resin front-surface/back surface
22a: resin back-surface
22b: second resin back-surface
23: pad for probe
24a: electrically conductive path
24b: second electrically conductive path
25a: inner wiring layer
25b: second inner wiring layer
27: second resin front-surface connection terminal
28: probe pin
29: solder
c1 to c4: ceramic layer (insulating material)
s1 to s4: ceramic layer
j1 to j8: resin layer

What is claimed is:
1. A wiring substrate for inspection apparatus comprising:
a single base substrate formed of an insulating material, the single base substrate having a base front-surface and a base back-surface located on opposite sides of the base substrate, and the base substrate including:
a plurality of base front-surface terminals provided on the base front-surface,
a plurality of base back-surface terminals provided on the base back-surface, and
a plurality of electrically conductive paths for conducting electricity between the plurality of base front-surface terminals and the plurality of back-surface terminals; and
a plurality of tile substrates mounted on the base front-surface terminals of the base substrate, each tile sub- strate having a front surface and a back surface located on opposite sides of the tile substrate, and each tile substrate including:

a plurality of probe pads provided on the front surface, a plurality of back-surface connection terminals provided on the back surface, a ceramic substrate section having an upper surface and a lower surface located on opposite sides of the ceramic substrate section, the ceramic substrate section including a single or a plurality of ceramic layers, a plurality of upper-surface connection terminals provided on the upper surface, a plurality of lower-surface connection terminals provided on the lower surface, and a plurality of through conductors for conducting electricity between the upper-surface connection terminals and the lower-surface connection terminals, a first resin substrate section laminated on the upper surface of the ceramic substrate section and including a laminate of a plurality of resin layers having a resin front-surface and a resin back-surface located on opposite sides of the laminate, one or more of the plurality of probe pads formed on the resin front-surface, a plurality of inner wiring layers formed between the resin layers, and a plurality of electrically conductive paths for conducting electricity between the probe pads and the upper-surface connection terminals through the respective inner wiring layers, and a second resin substrate section laminated on the lower surface of the ceramic substrate section and including a laminate of a plurality of second resin layers having a second resin front-surface and a second resin back-surface located on opposite sides of the laminate, a plurality of second resin front-surface connection terminals formed on the second resin front-surface, a plurality of second inner wiring layers formed between the second resin layers, and a plurality of electrically conductive paths for conducting electricity between the second resin front-surface connection terminals and the lower-surface connection terminals through the respective second inner wiring layers.

2. The wiring substrate for inspection apparatus according to claim 1, wherein, in a plan view, the plurality of tile substrates each have a rectangular shape and are mounted adjacent to one another on the base front-surface of the base substrate.

3. The wiring substrate for inspection apparatus according to claim 1, wherein the plurality of base front-surface terminals provided on the base front-surface of the base substrate and the plurality of back-surface connection terminals formed on the back surface of each tile substrate are individually electrically connected through solder.

4. The wiring substrate for inspection apparatus according to claim 1, wherein a probe pin stands on an upper surface of each of the probe pads formed on the resin front-surface of the first resin substrate section of the tile substrate.

* * * * *